United States Patent
Endoh et al.

(10) Patent No.: US 8,840,723 B2
(45) Date of Patent: Sep. 23, 2014

(54) MANUFACTURING APPARATUS OF POLYCRYSTALLINE SILICON

(75) Inventors: Toshihide Endoh, Suzuka (JP); Masayuki Tebakari, Suzuka (JP); Toshiyuki Ishii, Yokkaichi (JP); Masaaki Sakaguchi, Suzuka (JP)

(73) Assignee: Mitsubishi Materials Corporation, Tokyo (JP)

( * ) Notice: Subject to any disclaimer, the term of this patent is extended or adjusted under 35 U.S.C. 154(b) by 465 days.

(21) Appl. No.: 12/659,359

(22) Filed: Mar. 5, 2010

(65) Prior Publication Data

US 2010/0229796 A1   Sep. 16, 2010

(30) Foreign Application Priority Data

Mar. 10, 2009   (JP) ................. 2009-056057

(51) Int. Cl.
   *C30B 35/00*   (2006.01)
   *C23C 16/24*   (2006.01)
   *C01B 33/035*  (2006.01)

(52) U.S. Cl.
   CPC ............ *C23C 16/24* (2013.01); *C01B 33/035* (2013.01)
   USPC ........... 117/200; 117/84; 117/88; 117/101; 117/106; 117/201; 117/202; 117/204; 118/715; 118/722; 118/724; 118/728

(58) Field of Classification Search
   USPC ........... 117/84, 88, 101, 106, 200–202, 204; 117/902, 911, 924, 935; 118/715, 722, 724; 118/728
   See application file for complete search history.

(56) References Cited

U.S. PATENT DOCUMENTS

| | | | | | |
|---|---|---|---|---|---|
| 2,999,735 | A | * | 9/1961 | Reuschel | 423/350 |
| 3,191,924 | A | * | 6/1965 | Haus | 117/219 |
| 3,901,499 | A | * | 8/1975 | Sporrer | 117/219 |
| 4,756,086 | A | * | 7/1988 | Yajima et al. | 33/18.1 |
| 4,805,556 | A | * | 2/1989 | Hagan et al. | 118/725 |
| 5,456,945 | A | * | 10/1995 | McMillan et al. | 427/252 |
| 5,976,481 | A | | 11/1999 | Kubota et al. | |
| 6,639,192 | B2 | * | 10/2003 | Hertlein et al. | 219/541 |
| 2010/0055007 | A1 | * | 3/2010 | Ishii | 422/199 |

FOREIGN PATENT DOCUMENTS

| | | | |
|---|---|---|---|
| JP | 05-213697 | * | 8/1993 |
| JP | 05-213697 A | | 8/1993 |
| JP | 2007136909 A | * | 6/2007 |
| WO | WO-97/44277 A1 | | 11/1997 |
| WO | WO 2008066027 A1 | * | 6/2008 |

* cited by examiner

*Primary Examiner* — Michael Kornakov
*Assistant Examiner* — Kenneth A Bratland, Jr.
(74) *Attorney, Agent, or Firm* — Edwards Wildman Palmer LLP

(57) ABSTRACT

An apparatus for manufacturing polycrystalline silicon whereby raw-material gas is supplied to one or more heated silicon seed rods provided vertically in a reactor so as to deposit the polycrystalline silicon on a surface of the silicon seed rod, having a seed rod holding member, made of conductive material, having a holding hole in which a lower end of the silicon seed rod is inserted, the holding hole having a horizontal cross-sectional shape with at least two corners, and the holding member having a screw hole extending from the outer surface of the seed rod holding member to at least the holding hole and formed at the location of at least two corners of the holding hole; and a fixing screw which fixes the silicon seed rod and is threaded through at least one of the screw holes.

14 Claims, 9 Drawing Sheets

MANUFACTURING APPARATUS OF POLYCRYSTALLINE SILICON

BACKGROUND OF THE INVENTION

1. Field of the Invention

The present invention relates to an apparatus for manufacturing polycrystalline silicon which manufactures rods of polycrystalline silicon by depositing polycrystalline silicon on surfaces of heated silicon seed rods.

Priority is claimed on Japanese Patent Application No. 2009-56057, filed Mar. 10, 2009, the content of which is incorporated herein by reference.

2. Description of the Related Art

Generally, the Siemens process is known as a manufacturing method of high-purity polycrystalline silicon for semiconductor. The Siemens process is a manufacturing method in which raw-material gas including mixed gas of chlorosilane and hydrogen is in contact with heated silicon seed rods so that polycrystalline silicon generated by thermal decomposition and hydrogen reduction of the raw-material gas is deposited on the surfaces of the silicon seed rods. As an apparatus for carrying out the manufacturing method, a polycrystalline silicon reactor is used in which a plurality of silicon seed rods (i.e., starter filaments) are mounted on electrodes which are installed on a reactor floor of the closed reactor (refer to Japanese Unexamined Patent Application, First Publication No. H05-213697).

Conventionally, in the reactor, a seed assembly which is formed into a Π-shape from two rod-like silicon seed rods provided along the vertical direction and a connecting member which connects the top ends of the silicon seed rods are fixed. The seed assembly is highly-heated by being supplied electricity via the electrodes so that Joule heat is generated.

The silicon seed rod is manufactured, for example, by method of drawing up single crystal from melted silicon and making into an elongated silicon seed rod, or by cutting a polycrystalline silicon preform produced by the Siemens process.

By the former method, comparatively straight cylindrical silicon seed rods can be obtained. However, manufacturing efficiency is low since a monocrystalline silicon rod requires long time to be produced.

On the other, by the latter method, high-purity silicon seed rods can be obtained since the silicon seed rods are cut from a high-purity polycrystalline silicon preform (e.g., a rod-shape). However, there is a case in which thermal stress is generated in the polycrystalline silicon rods produced by the Siemens process in the producing process, for example, as described in PCT International Publication WO97/44277, so that the silicon seed rods might be bended after cutting.

In the process of depositing polycrystalline silicon on the surfaces of the silicon seed rods by reacting of raw-material gas in the reactor, the weight of the polycrystalline silicon deposited on the surfaces of the silicon seed rods reaches several ten kilograms after continuous reaction. If the silicon seed rods holding the polycrystalline silicon are bended, the electrodes or the silicon seed rods are easily broken by the weight of the deposited polycrystalline silicon. Further, since the plurality of silicon seed rods are vertically arranged in the reactor, the intervals between the silicon seed rods are not even if the silicon seed rods are bended, so that the silicon seed rods are overheated at adjacent parts with each other by the radiation heat thereof. Therefore, the deposition amounts of the polycrystalline silicon are not even by position, then the polycrystalline silicon deposits unevenly, so that the product quality may be deteriorated. Therefore, it is preferable that the silicon seed rods in the reactor stand vertically.

Therefore, the deformations of the silicon seed rods are corrected so as to erect the silicon seed rods, in a pair of silicon seed rods which are connected to each other, by attaching the connecting member in a state in which the silicon seed rods are fixed after adjusting the bending direction thereof. However, there is a case in which the silicon seed rods are hard to erect by only adjusting the bending direction of the silicon seed rods and attaching the connecting member. In this case, the connecting member is attached again; and the silicon seed rods are rotated and fixed again. However, those tasks delay the manufacturing, so that the productivity is deteriorated. Furthermore, the silicon seed rods may be broken with high-probability during those tasks since the plurality of seed assemblies are arranged. Moreover, the tasks take time so that the silicon seed rods are exposed to air for a long time; then the probability of contamination on the surfaces of the silicon seed rods may become high.

BRIEF SUMMARY OF THE INVENTION

The present invention is achieved in consideration of the above circumstances, and has an object to provide an apparatus for manufacturing polycrystalline silicon in which high-quality silicon products can be manufactured with excellent workability.

In order to achieve the above object, according to the present invention, an apparatus for manufacturing polycrystalline silicon whereby raw-material gas is supplied to one or more heated silicon seed rods provided vertically in a reactor so as to deposit the polycrystalline silicon on a surface of the silicon seed rod, having: a seed rod holding member, made of conductive material, having a holding hole in which a lower end of the silicon seed rod is inserted, the holding hole having a horizontal cross-sectional shape with at least two corners, and the seed rod holding member having a screw hole extending from the outer surface of the seed rod holding member to at least the holding hole and formed at the location of at least two corners of the holding hole; and a fixing screw which fixes the silicon seed rod and is threaded through at least one of the screw holes.

According to the present invention, in a case in which deformations of a seed assembly (i.e., a pair of the silicon seed rods and the connecting member) cannot be corrected enough though the connecting member is attached, or in a case in which the holding hole of the silicon seed rod is off-center or is inclined, by altering the screw hole which is threaded through the fixing screw, it is possible to adjust the standing position and the posture of the silicon seed rods according to the dimensional difference between the silicon seed rod and the holding hole. Therefore, the deformations of the silicon seed assembly can be corrected by a simple task of altering the threaded position of the fixing screw.

In the apparatus for manufacturing polycrystalline silicon, it is preferable that the reactor have a bottom plate portion constructing a reactor floor, and the seed rod holding member be held on the bottom plate portion rotatably around the holding hole. In this case, it is possible to adjust the posture of the silicon seed rod greatly by rotating the seed rod holding member. As a result, it is possible to correct the deformation of the silicon seed assembly more effectively.

According to the apparatus for manufacturing polycrystalline silicon of the present invention, it is easy to correct the deformation of the silicon seed assembly in which polycrystalline silicon is deposited, so that it is possible to improve the manufacturing workability and the product quality of polycrystalline silicon.

DETAILED DESCRIPTION OF THE INVENTION

Below, an embodiment of an apparatus for manufacturing polycrystalline silicon according to the present invention will be described with reference to drawings.

Figure 1:
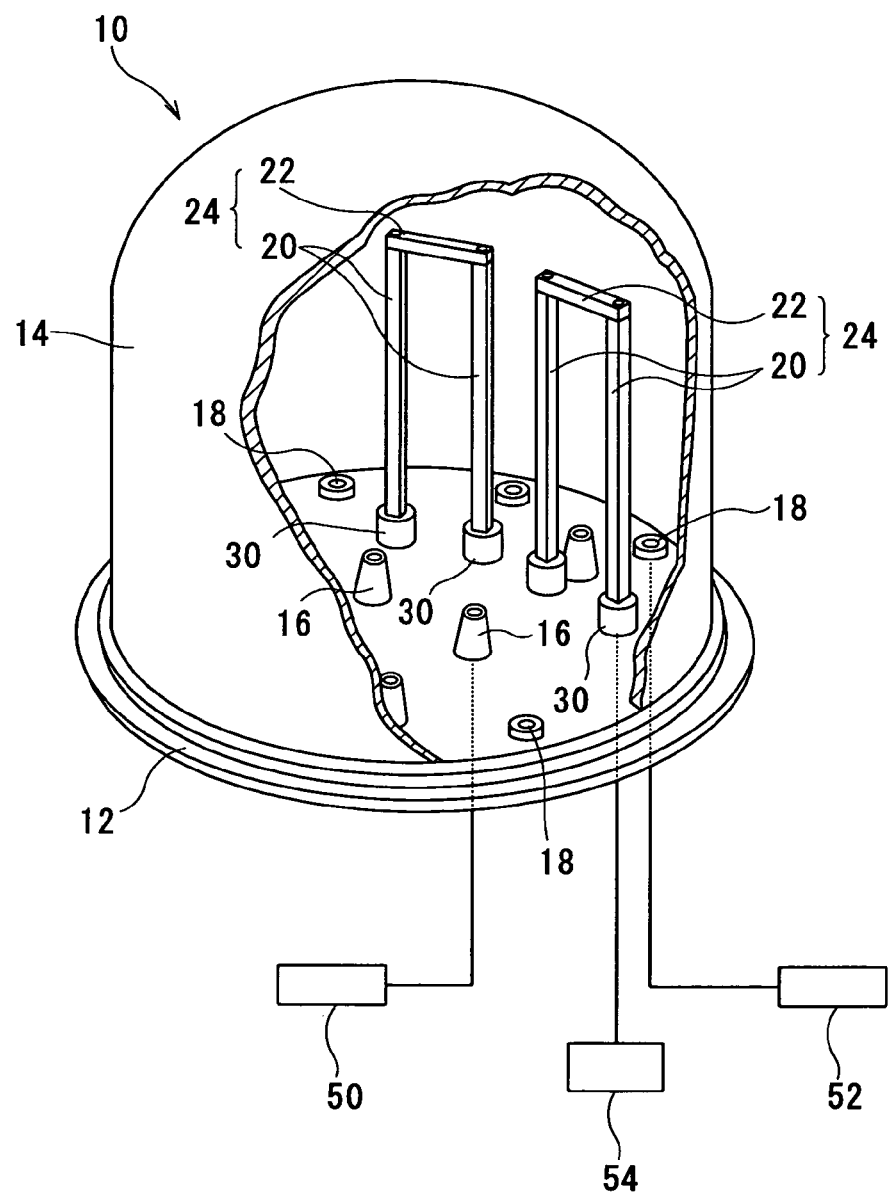
FIG. 1 is a partially cutaway perspective view of a bell jar of a reactor.

FIG. 1 is an overall view of the apparatus for manufacturing polycrystalline silicon which is applicable to the present invention. A reactor 10 of the apparatus for manufacturing polycrystalline silicon is provided with a bottom plate portion 12 which constructs the reactor floor, and a bell-shaped bell jar 14 which is detachably attached on the bottom plate portion 12. An upper surface of the bottom plate portion 12 is formed as substantially a flat horizontal plane. The bell jar 14 has a hanging-bell shape, in which an inner space thereof is the highest at the center and the lowest at the outer peripheral portion. The walls of the bottom plate portion 12 and the bell jar 14 construct a jacket structure (the illustration is omitted) and are cooled by coolant water.

The bottom plate portion 12 is provided with a plurality of electrode units 30 in which a silicon seed rod 20 for polycrystalline silicon is attached to, a plurality of ejection nozzles 16 (i.e., gas supply ports) ejecting raw-material gas including chlorosilane gas and hydrogen gas into the reactor, and a plurality of gas discharge ports 18 discharging gas after reaction to the outside of the reactor.

The ejection nozzles 16 of raw-material gas is arranged across the upper surface of the bottom plate portion 12 of the reactor 10 with appropriate intervals therebetween so as to supply raw-material gas evenly to each of the silicon seed rods 20. The ejection nozzles 16 are connected to a raw-material gas supply source 50 which is located the outside of the reactor 10. The gas discharge ports 18 are formed with appropriate intervals along the circumferential direction in the vicinity of the outer peripheral portion on the bottom plate portion 12, and are connected to an exhaust gas treatment system 52 which is located the outside of the reactor 10. The electrode units 30 are connected with a power circuit 54.

Each of the silicon seed rods 20 is fixed with the lower end of the silicon seed rod 20 being inserted into the electrode unit 30, and stands upward. A connecting member 22 connecting two silicon seed rods 20 as a pair is attached on the top end of each of the silicon seed rods 20. Two cylindrical through-holes 22a are formed at both ends of the connecting member 22, and engaged to columnar boss portions 20a which are formed at the top ends of the silicon seed rods 20 (see FIG. 3). The connecting members 22 are made of silicon as same as the silicon seed rods 20. A seed assembly 24 having Π-shape is constructed from two silicon seed rods 20 and the connecting member 22 connecting the silicon seed rods 20. The seed assemblies 24 are arranged in substantially a concentric pattern since the electrode units 30 are arranged in a concentric pattern with respect to the center of the reactor 10.

Figure 2:
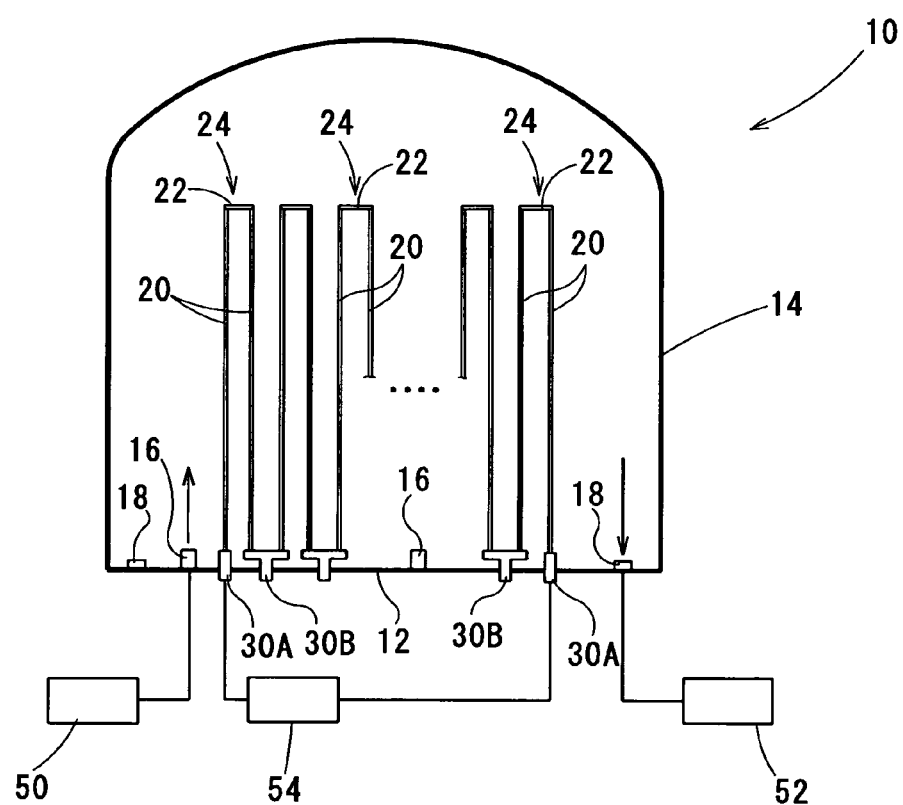
FIG. 2 is a schematic sectional view of the reactor of FIG. 1.

More specifically for the electrode units 30, as shown in FIG. 2, electrode units 30 (30A) holding one silicon seed rod 20 and electrode units 30 (30B) holding two silicon seed rods 20 are arranged in the reactor 10. The plurality of seed assemblies 24 are provided so as to connect between the electrode units 30A and 30B. The electrode units 30A and 30B are lined so that one electrode unit 30A, the plurality of electrode units 30B, and one electrode unit 30A are in series, and connect the plurality of the seed assemblies 24 in series. That is, one of the silicon seed rods 20 of one seed assembly 24 is held by one of the electrode units 30; and the other of the silicon seed rods 20 of the seed assembly 24 is held by the adjacent another electrode unit 30.

That is, the electrode unit 30A holds one of the two silicon seed rods 20 of one seed assembly 24, and each of the electrode units 30B holds one silicon seed rod 20 of two pair of the seed assembly 24. The electrode units 30A and 30B and the seed assemblies 24 are constructed so as to be supplied electricity via cables connected to the electrode units 30A at the both end of the series.

In the apparatus for manufacturing polycrystalline silicon constructed above, by supplying electricity via the electrode units 30 to the silicon seed rods 20, the silicon seed rods 20 are heated by electrical resistance. Further, the silicon seed rods 20 are heated by the radiation heat of the adjacent silicon seed rods 20 each other. Then, polycrystalline silicon is deposited by the reaction of the raw-material gas on the surface of the silicon seed rods 20 which are heated by Joule heat synergistically with the radiation heat.

The structure of the electrode units 30 (30A and 30B) for holding the silicon seed rods 20 will be described.

Figure 3:
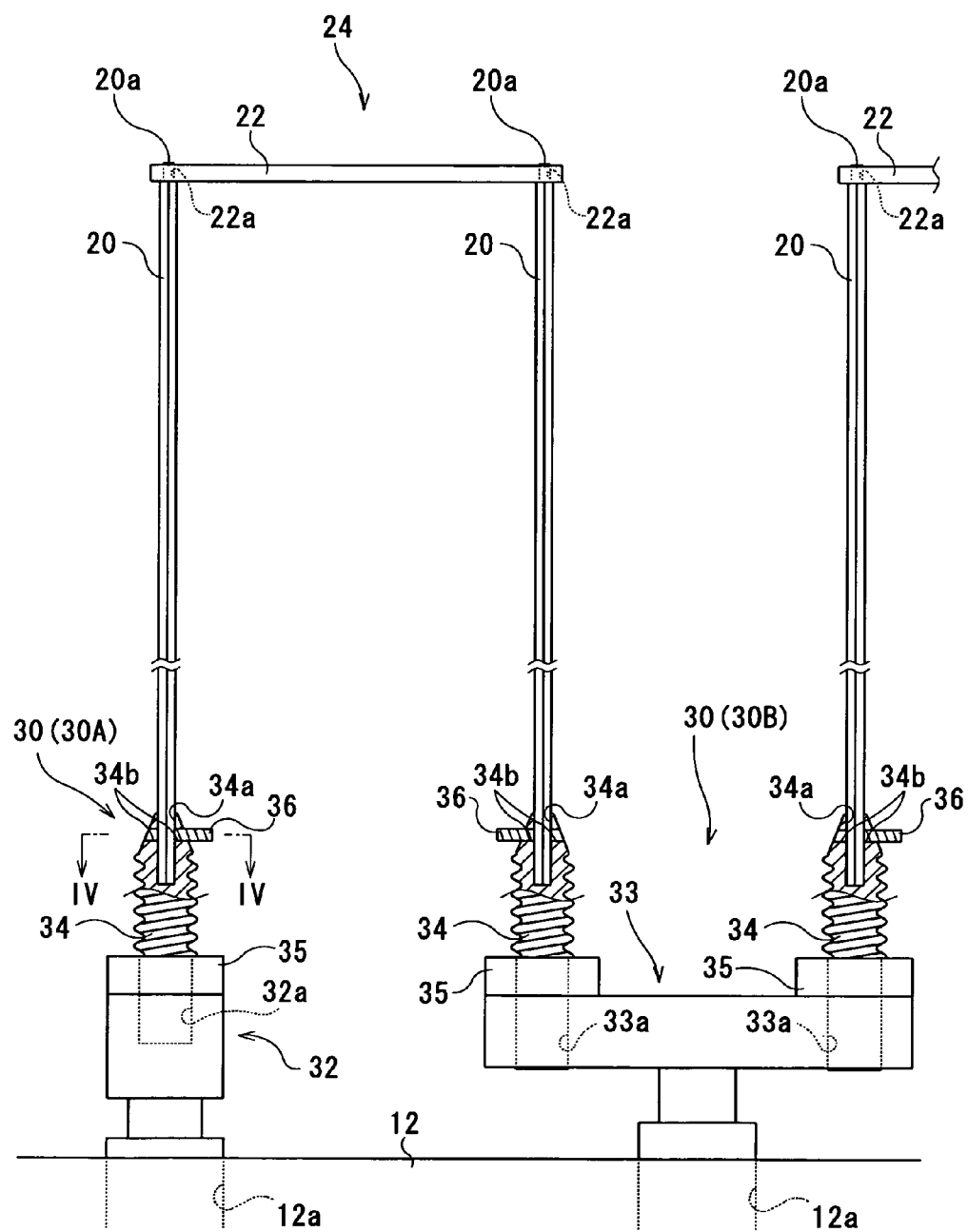
FIG. 3 is a partially sectional view of electrode units and seed assemblies in the reactor.

As shown in FIG. 3, the electrode units 30A has a holder portion 32 which is inserted in a through-hole 12a formed at the bottom portion 12 of the reactor 10, and a seed rod holding member 34 holding the silicon seed rod 20 that is fixed to the upper portion of the holder portion 32. Also, the electrode unit 30B has a holder portion 33 which is inserted in the through-hole 12a formed at the bottom plate portion 12 of the reactor 10, and the seed rod holding members 34 holding the silicon seed rods 20 that is fixed to the upper portion of the holder portion 33.

The seed rod holding member 34 are substantially columnar members having holding holes 34a in which the silicon seed rods 20 are inserted are formed on the top end thereof, and helical threads are formed on the outer peripheral surfaces thereof. The seed rod holding members 34 and the holder portion 32 are made of conductive material (e.g., carbon). The holder portions 33 are made of conductive material (e.g., stainless steel). An internal screw hole 32a which engages with the seed rod holding member 34 is formed on the upper portion of the holder portion 32. An internal screw hole 33a which engages with the seed rod holding member 34 is formed on the upper portion of the holder portion 33. Nuts 35 are threaded with the seed rod holding member 34 which engage with the internal screw holes 32a and 33a.

Figure 4:
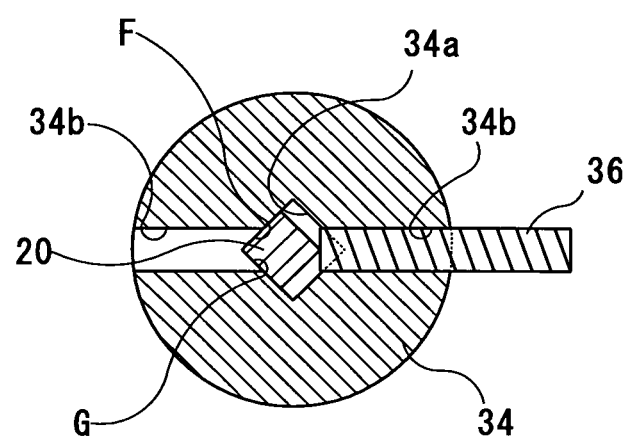
FIG. 4 is a cross-sectional view of FIG. 3 along the line IV-IV.

As shown in FIG. 4, the holding hole 34a of the seed rod holding member 34 has a rectangular shape having four corners in the horizontal cross-section. In the holding hole 34a, screw holes 34b are formed perpendicular to the holding hole 34a at the opposed two corners so as to be introduced from the outer surface. Fixing screw 36 fixing the silicon seed rod 20 is threaded through one of the screw holes 34b. The fixing screw 36 is made of carbon as same as the seed rod holding member 34. A tool groove for a screwdriver of "+" shape or "−" shape is formed at one end portion of the fixing screw 36.

The silicon seed rod 20, which is inserted in the holding hole 34a, is a rod-shape member having the substantially rectangular cross-sectional shape smaller than that of the holding hole 34a. Therefore, the silicon seed rod 20 is movable with respect to the seed rod holding member 34 in a range of dimensional difference from the holding hole 34a. As shown in FIG. 4, the fixing screw 36 is tightened, and then one end thereof presses the corner (i.e., a ridge line) of the silicon seed rod 20 toward two surfaces F and G of the holding hole 34a facing the one end of the fixing screw 36, so that the silicon seed rod 20 is fixed to the seed rod holding member 34. Then, the silicon seed rod 20 and the seed rod holding member 34 are electrically connected with each other by the contacts of the two surfaces.

Figure 5:
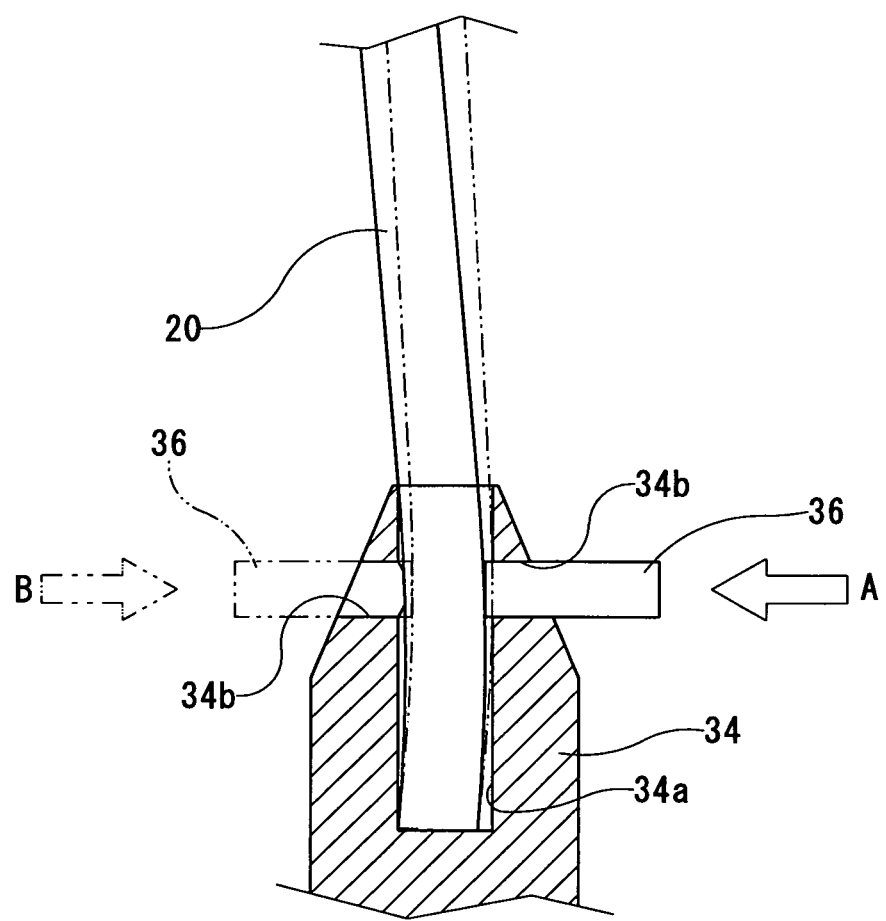
FIG. 5 is a schematic view showing a change of a posture of silicon seed rods with respect to a seed rod holding member according to the threaded direction of fixing screws.

The fixing screw 36 can be threaded through whichever the screw hole 34b. The holding position and the posture of the silicon seed rod 20 can be adjusted according as the fixing screw 36 is threaded through which the screw hole 34b. FIG. 5 schematically shows an example of a relationship of the holding positions and the postures according to the pressing directions by the fixing screw 36 of the silicon seed rod 20 in the holding hole 34a. As shown in FIG. 5, when the silicon seed rod 20 is deformed, by screwing the fixing screw 36 from the right as the arrow A, there is a case in which the top end of the silicon seed rod 20 is shifted from the axis of the holding hole 34a to the left in the figure as shown by a solid line. In this case, by removing the fixing screw 36 once from the screw hole 34b and screwing the fixing screw 36 again into the other screw hole 34b from the left as the arrow B, the posture of the silicon seed rod 20 is changed as shown by the chain line, and can be adjusted so as to conform the axis of the holding hole 34a.

Figure 6:
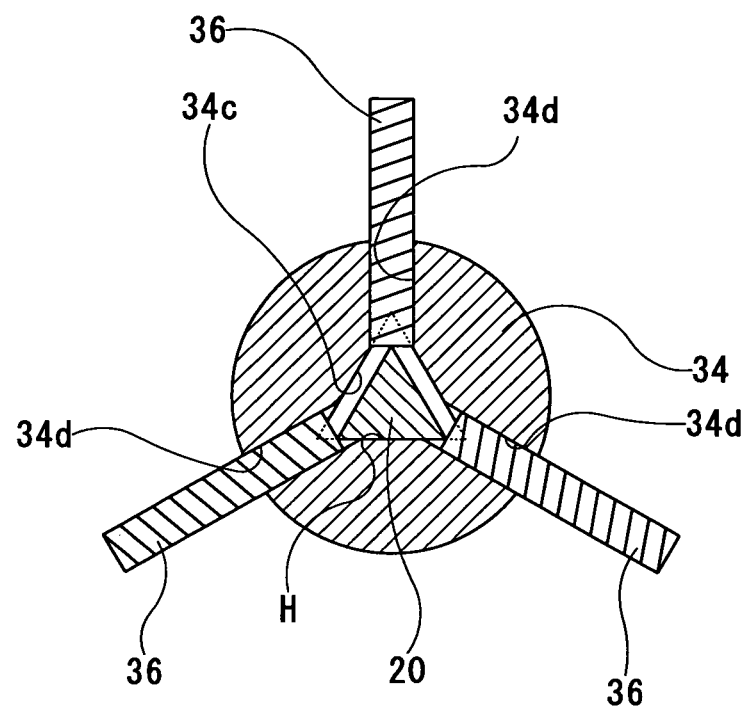
FIG. 6 is a cross-sectional view showing a silicon seed rod having a triangle cross-sectional shape.

The cross-sectional shape of the silicon seed rod 20 is not limited to rectangle. Triangle, hexagon, octagon or the like in which the corner (i.e., ridge line) is pressed by the fixing screw, and the surface facing the corner is abutted on the inner surface of the holding hole are also available for the silicon seed rod. For example, as shown in FIG. 6, in a case in which the cross-sectional shape of the silicon seed rod 20 is triangle, the holding hole 34c of the seed rod holding member 34 is formed so as to have the larger triangle cross-sectional shape than that of the silicon seed rod 20. Screw holes 34d are formed at the corners of the holding hole 34c so as to be introduced from the outer surface of the seed rod holding member 34. The fixing screws 36 are screwed into the screw holes 34d, then a surface H is pressed against the inner surface of the holding hole 34c, so that the silicon seed rod 20 is fixed. In this structure in which the fixing screws 36 are threaded through the screw holes 34d, the silicon seed rod 20 can be fixed with adjusting the holding position and the posture according to each of the screwing amounts of the fixing screws 36 with respect to the screw holed 34d.

Processes of mounting the silicon seed rods 20 using the above-mentioned seed rod holding member 34 will be described.

Figure 7:
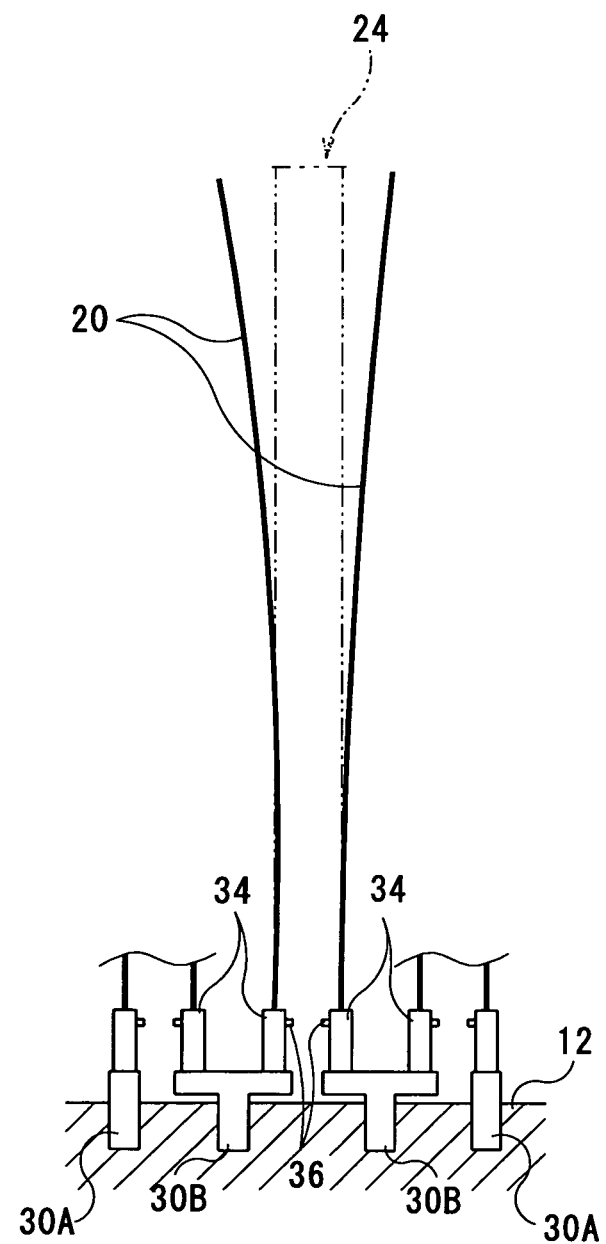
FIG. 7 is a schematic view showing a silicon seed rod which is attached to an electrode unit.

First, as shown in FIG. 7, a pair of silicon seed rods 20 are set on the seed rod holding members 34 so as to be separated at the top ends thereof while adjusting the directions of the silicon seed rods 20. If the silicon seed rods 20 are provided in such a manner, there is a case in which the deformations of the silicon seed rods 20 are corrected so that the seed assembly 24 can stand substantially vertically as shown in FIG. 7 by chain lines only by attaching the connecting member 22.

Figure 8:
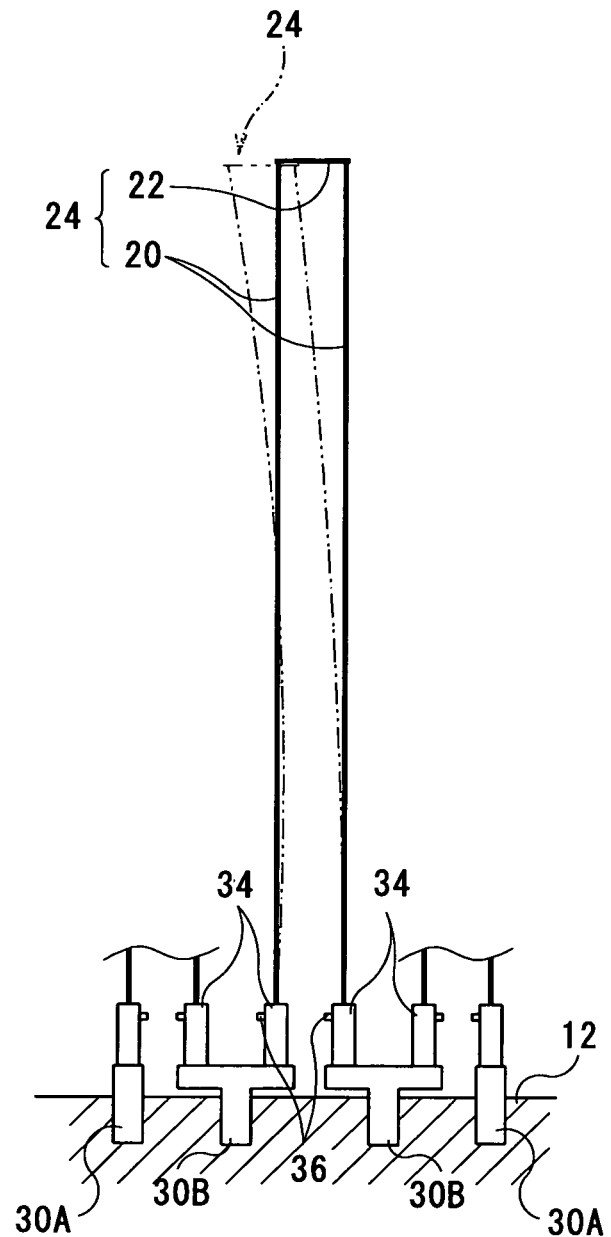
FIG. 8 is a schematic view showing a seed assembly attached to an electrode unit.

However, there is a case in which the seed assembly 24 is deformed, for example as shown in FIG. 8 by chain lines, since the deformation of the silicon seed rod 20 cannot be corrected enough although attaching the connecting member 22. In this case, in a state in which the connecting member 22 is attached, by removing the fixing screw 36 for one or both of the silicon seed rods 20 constructing the seed assembly 24, and then screwing the removed fixing screw 36 to the opposed screw hole 34b, thus the posture of the silicon seed rod 20 is adjusted, and the seed assembly 24 can stand substantially vertically.

The silicon seed rods 20 of the seed assembly 24 are connected with the connection member 22 by the engagement of columnar boss portion 20a and through-hole 22a. Therefore, by rotating the seed rod holding member 34 which engaging the holder portion 32 and 33, the silicon seed rods 20 can be rotated in a state in which the connecting member 22 is attached. In this case, since the postures of the pair of the silicon seed rods 20 which are connected by the connection member 22 are relatively changed, the deformation of the silicon seed rods 20 of the seed assembly 24 can be corrected.

As described above, according to the apparatus for manufacturing polycrystalline silicon of the present invention, two or more screw holes in which fixing screws fixing the silicon seed rods are threaded are formed at the rectangular holding hole which is formed at the seed rod holding member. Therefore, by altering the screw hole in which the fixing screw is threaded; the pressing direction of the silicon seed rod can be changed with respect to the seed rod holding member, and the silicon seed rods (i.e., the seed assembly) can stand substantially vertically. Therefore, the silicon seed rods is prevented from breaking by the weight of the deposited polycrystalline silicon, and it is prevented that the quality of polycrystalline silicon is deteriorated due to differences of the interval between the silicon seed rods. That is, since the deformation of the silicon seed rod can be corrected simply by altering the fixing position of the fixing screw, workability is improved, so that the probability of breaking the silicon seed rod while assembling can be reduced; furthermore, the silicon seed rod is not exposed to the air for a long time, and the contamination at the surface of the silicon seed rod can be reduced. Therefore, the apparatus which can manufacture high-quality polycrystalline silicon is realized.

The invention is not limited to the embodiments, and various modifications can be made without departing from the spirit and scope of the invention. For example, in the above embodiment, the screw holes are formed at two corners which are opposed each other. However, the screw holes can be formed at every corner (i.e., four corners) of the holding hole. Furthermore, the screw holes may be formed at the same height position as the above embodiment, or at the different height position. In a case in which the screw holes are formed at the different height position, the pressing direction of the silicon seed rod can be changed to a plurality of directions, so that the posture of the silicon seed rod can be delicately adjusted and the seed assembly can be easily set vertically. The case in which the silicon seed rod has deformation is described in the above embodiment. However, according to the present invention, the seed assembly can be set vertically also in a case in which the holding hole for the silicon seed rod is off-center or inclined.

Furthermore, in the electrode unit 30A, the holding structure of the seed rod holding member is not limited as the above embodiment in which the seed rod holding member 34 is held by being screwed into the internal screw hole 32a of the holder portion 32 and the nut 35 is attached.

Figure 9:
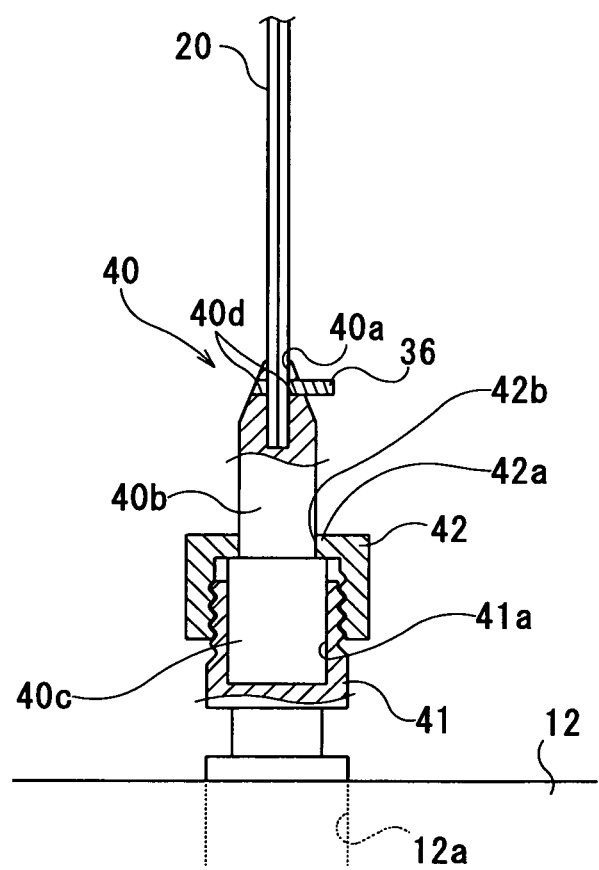
FIG. 9 is a partially cross-sectional view showing an example of a holding construction in a seed holding member.

For example, in a seed rod holding member 40 shown in FIG. 9, a holding hole 40a in which the silicon seed rod 20 is inserted is formed at a upper portion 40b. However, the seed rod holding member 40 does not have the helical thread formed on the outer surface thereof, but has a stepped columnar shape in which an outer diameter of a lower portion 40c is larger than that of the upper portion 40b. The holding hole 40a has the same shape as that of the holding hole 34a of the above embodiment, and movably holds the silicon seed rod 20. Therefore, also in the seed rod holding member 40, the posture of the silicon seed rod 20 can be adjusted by altering screw holes 40d to which the fixing screw 36 is threaded.

A holder body 41 which holds the seed rod holding member 40 has a cylindrical holding hole 41a in which the lower portion 40c of the seed rod holding member 40 is rotatably inserted and held, and a male screw formed on the outer surface thereof. A nut member 42 which screws together with the male screw has an inward flange 42a at the top portion thereof. A through-hole 42b is formed at the center of the inward flange 42a, and has an inner diameter through which the upper portion 40b of the seed rod holding member 40 can pass and the lower portion 40c cannot pass. The holding hole 41a of the holder body 41 has a depth smaller than the height of the lower portion 40c of the seed rod holding member 40, and is formed so that the upper portion 40b of the seed rod holding member 40 protrudes from the top end surface of the holder body 41.

That is, according to the structure shown in FIG. 9, by inserting the lower portion 40c of the seed rod holding member 40 into the holding hole 41a of the holder body 41, and fastening the nut member 42 to the holder body 41, the seed rod holding member 40 can be rotatably held with respect to the bottom plate 12.

What is claimed is:

1. An apparatus for manufacturing polycrystalline silicon whereby raw-material gas is supplied to one or more heated silicon seed rods provided vertically in a reactor and provided to comprise a corner in a horizontal cross-section so as to deposit the polycrystalline silicon on a surface of the silicon seed rod, comprising:
    a seed rod holding member, made of carbon, having a holding hole with one opening in which a lower end of the silicon seed rod is inserted, the holding hole having a horizontal cross-sectional shape with at least two corners, and the seed rod holding member having a plurality of screw holes formed at an upper portion of the holding hole and extending from the outer surface of the seed rod holding member to at least the holding hole and formed at the at least two corners of the holding hole; and,
    a fixing screw which fixes the silicon seed rod is made of the same carbon as the seed rod holding member and is threaded through at least one of the plurality of screw holes, and
    wherein
    the silicon seed rod is partially inserted into one of the plurality of screw holes in a horizontal cross section;
    a horizontal cross-sectional area of the holding hole is larger than a horizontal cross-sectional area of the silicon seed rod so that a dimensional difference is formed between the silicon seed rod and the holding hole; and
    when the silicon seed rod is inserted in the holding hole, the corner of the silicon seed rod is pressed by the fixing screw and the silicon seed rod is in contact with an inner surface of the holding hole.

2. The apparatus for manufacturing polycrystalline silicon according to claim 1, wherein
    the reactor has a bottom plate portion constructing a reactor floor, and
    the seed rod holding member is held on the bottom plate portion rotatably around the holding hole.

3. The apparatus for manufacturing polycrystalline silicon according to claim 1, wherein the plurality of screw holes are formed perpendicular to the holding hole and formed at the location of at least two opposed corners.

4. The apparatus for manufacturing polycrystalline silicon according to claim 1, wherein the holding hole, in the horizontal cross-section, has a rectangular shape having four corners.

5. The apparatus for manufacturing polycrystalline silicon according to claim 1, wherein
    the holding hole in horizontal cross-section, has a triangle shape having three corners.

6. The apparatus for manufacturing polycrystalline silicon according to claim 1, wherein the holding hole, in the horizontal cross-section, has a polygon shape having at least two corners.

7. The apparatus for manufacturing polycrystalline silicon according to claim 1, wherein the holding hole, in the horizontal cross-section, has a polygon shape having screw holes formed at every corner.

8. The apparatus for manufacturing polycrystalline silicon according to claim 1, wherein the screw holes are formed at a same height position.

9. The apparatus for manufacturing polycrystalline silicon according to claim 1, wherein the plurality of screw holes are formed at different height positions.

10. The apparatus for manufacturing polycrystalline silicon according to claim 1, wherein the seed rod holding member has a helical thread on an outer surface thereof.

11. The apparatus for manufacturing polycrystalline silicon according to claim 1, wherein
    the seed rod holding member has a stepped columnar shape on an outer surface thereof, in which an outer diameter of a lower portion is larger than that of an upper portion.

12. The apparatus for manufacturing polycrystalline silicon according to claim 1, wherein the seed rod holding member is inserted into a holder body which has a cylindrical holding hole for the seed rod holding member and a nut member which connects to the holder body.

13. The apparatus for manufacturing polycrystalline silicon according to claim 1, wherein
    the silicon seed rod has a polygon shape in the horizontal cross-section,
    in a state in which the silicon seed rod is inserted in the holding hole, a surface of the silicon seed rod opposite to the corner is in contact with and fixed to the inner surface of the holding hole.

14. The apparatus for manufacturing polycrystalline silicon according to claim 1, wherein a tool groove for a screwdriver of "+" shape or "−" shape is formed at one end portion of the fixing screw.

* * * * *